United States Patent [19]

Witcraft et al.

[11] Patent Number: 5,280,894

[45] Date of Patent: Jan. 25, 1994

[54] FIXTURE FOR BACKSIDE WAFER ETCHING

[75] Inventors: William F. Witcraft, Minneapolis; Daniel W. Youngner, Maple Grove, both of Minn.

[73] Assignee: Honeywell Inc., Minneapolis, Minn.

[21] Appl. No.: 954,449

[22] Filed: Sep. 30, 1992

[51] Int. Cl.⁵ .............................................. B25B 1/20
[52] U.S. Cl. .................................... 269/287; 269/903
[58] Field of Search .............. 206/312, 328, 445, 303, 206/0.8; 269/903, 287, 288, 21, 208; 156/345

[56] References Cited

U.S. PATENT DOCUMENTS

| | | | |
|---|---|---|---|
| 4,165,573 | 8/1979 | Richards | 206/0.8 |
| 4,327,830 | 5/1982 | Patel et al. | 206/312 |
| 4,605,469 | 8/1986 | Shih et al. | 269/287 |
| 4,830,182 | 5/1989 | Nakazato et al. | 206/328 |
| 4,886,162 | 12/1989 | Ambrogio | 206/328 |
| 5,180,150 | 1/1993 | Prusak et al. | 269/903 |

Primary Examiner—Robert C. Watson
Attorney, Agent, or Firm—Gregory A. Bruns

[57] ABSTRACT

A fixture which includes a lower base for supporting and protecting the front surface of a semiconductor wafer and a clamp. The lower base has an upper end having a central surface portion recessed from a peripheral surface portion for supporting by means of an O ring the peripheral portion of the front surface of the wafer. The clamp rests on a peripheral portion of the back surface of the wafer with the remaining back surface exposed to the backside etching process. A pin and hole arrangement help align the clamp to the base. Holes in the base equalize pressure on both sides of the wafer.

17 Claims, 2 Drawing Sheets

FIXTURE FOR BACKSIDE WAFER ETCHING

BACKGROUND OF THE INVENTION

The present invention relates generally to semiconductor fabrication and specifically to a technique for backside wafer etching. Backside wafer etching or stripping is typically used to strip polysilicon, nitride or oxide. Backside wafer etching is done after the thin film depositions and before metallization is applied.

In the past, industry practice has been to coat the front side of the wafer with resist to protect the front side during the process of stripping the backside of the wafer.

The steps for this stripping process typically include the following.

Precoating inspection of the wafer.
Coating the front side of the wafer with resist.
Inspection for pinholes in resist.
Baking of the wafer.
Plasma etching to strip polysilicon, nitride or oxide from backside of wafer.
$O_2H$ Asher process to begin removal of resist.
Wet etch stripping process, e.g., sulfuric peroxide.
Post inspection to confirm removal of resist.

The steps that have been described represent a significant number of steps in the processing of semiconductors. The steps described also represent a significant cost to semiconductor manufacturers. Thus a need exists for a technique to reduce the number of steps required for back side etching of semiconductor wafers.

SUMMARY OF THE INVENTION

The present invention solves these and other needs by providing a technique for dramatically reducing the number of processing steps required for backside wafer etching.

In the preferred embodiment of the present invention the fixture includes a lower base and a clamp. The lower base includes a central surface portion and a remaining surface portion. The remaining surface portion supports, by means of an O ring arrangement, a semiconductor wafer at a periphery of the wafer front side surface. The remainder of the wafer front side surface is spaced from the central surface portion of the base and thus protected from the processing. A clamp in the form of an inwardly extending ring joined to a tubular portion is received by the combination of the base and the supported semiconductor wafer. The ring portion rests on a periphery of the backside of the semiconductor wafer with the remaining backside exposed to the stripping process. A lip in the remaining surface portion of the base assists in the proper positioning of the wafer on the base. Alignment pins in the base and matching holes in the clamp provide for aligning the clamp with the base. Pressure equalizing holes in the base permit the protected front side of the wafer to be exposed to ambient pressure during the processing.

DETAILED DESCRIPTION

Figure 1:
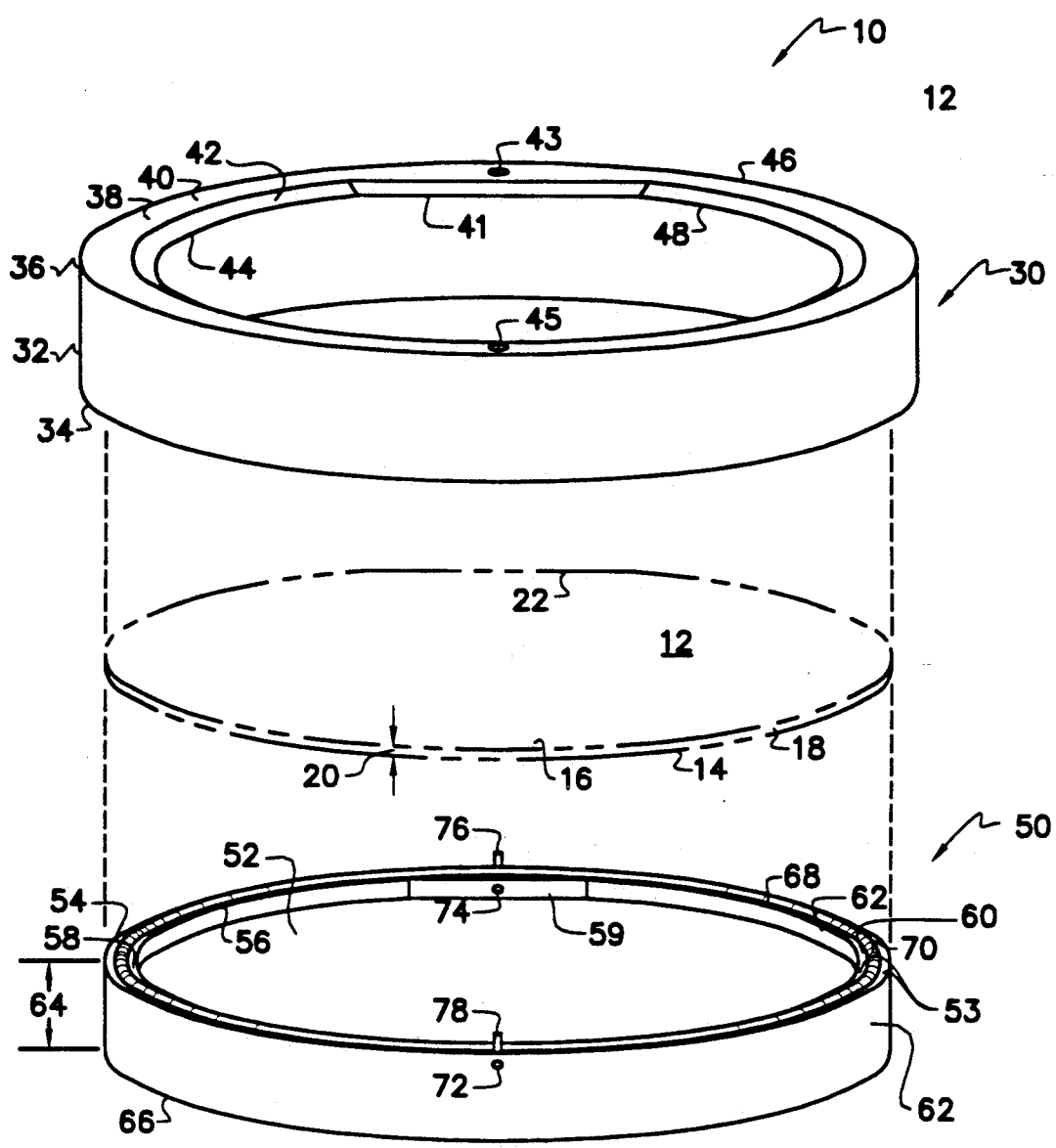
FIG. 1 shows an exploded perspective view of a fixture for backside wafer etching with a semiconductor wafer shown in phantom in accordance with the present invention.
Figure 2:
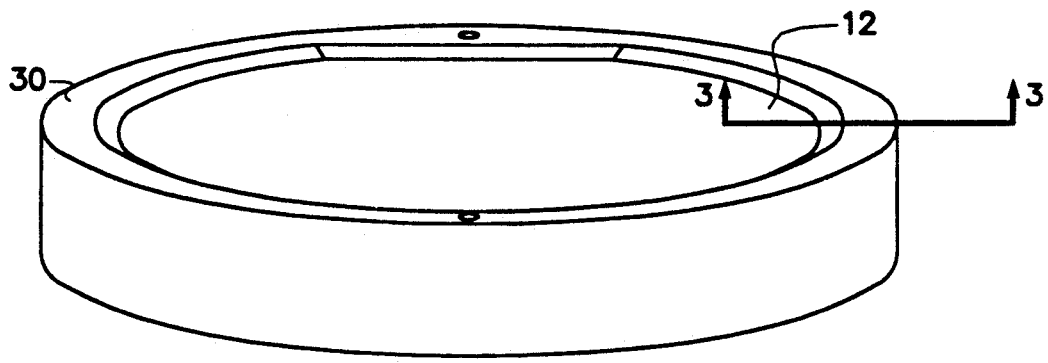
FIG. 2 shows a perspective view of the present invention with a semiconductor wafer also shown.
Figure 3:
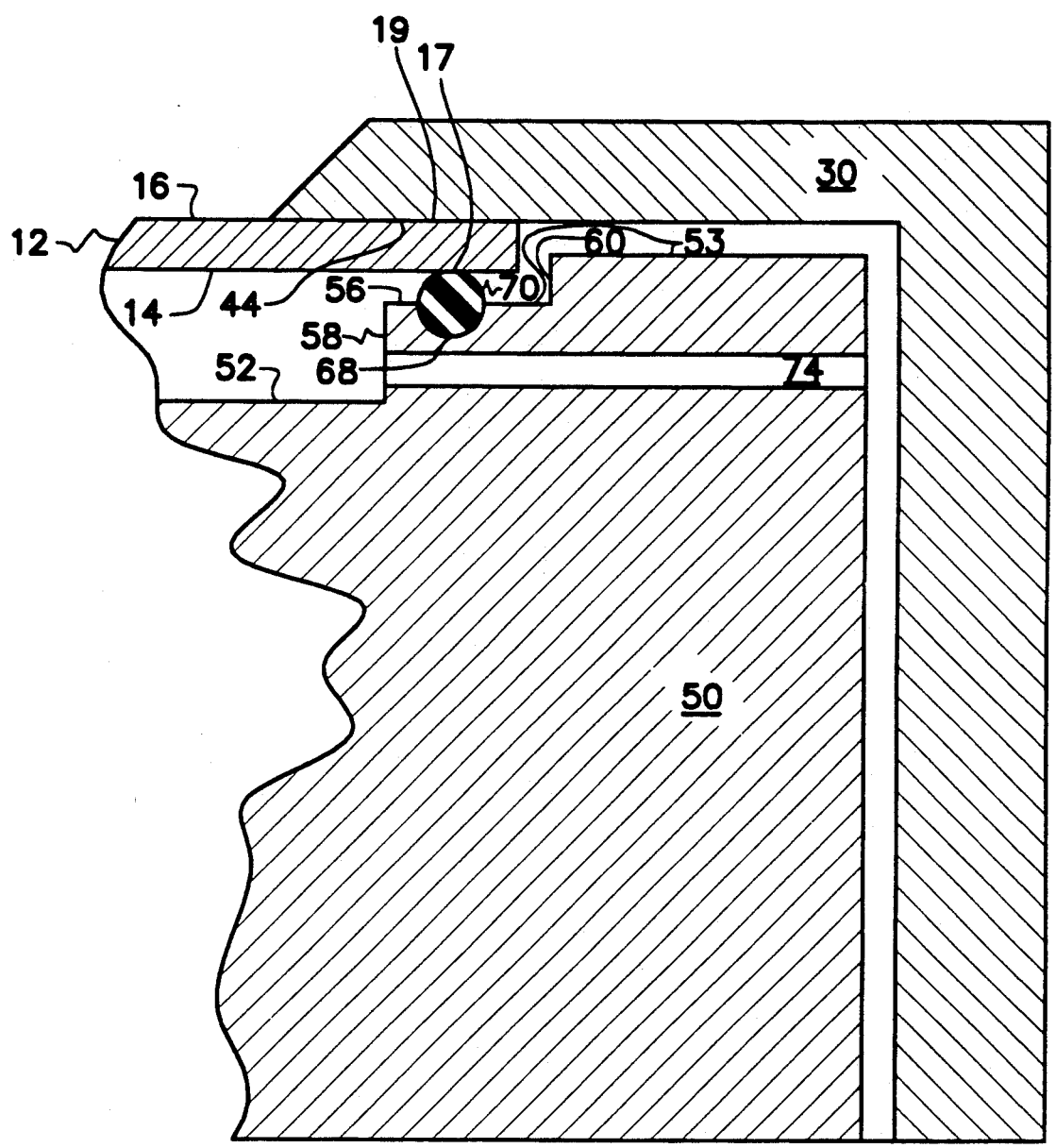
FIG. 3 shows a cross-sectional view of the device of FIG. 2 along sectional lines 3—3.

A device for use as a fixture when performing backside stripping of a semiconductor wafer is shown in the drawings and is generally designated 10. A semiconductor wafer 12 will have a front side or surface 14 which includes circuits that have been formed in wafer 12. Wafer 12 also includes backside or back surface 16. Wafer 12 has a thickness 20 and an edge 18. Edge 18 includes flattened portion or flat 22.

Device 10 includes clamp 30 which has a generally circular form. Clamp 30 includes tubular portion 32 having a lower open end 34 and an upper end 36. Clamp 30 also includes ring portion 38. Ring 38 has a flat portion 40 and a beveled portion 42. Ring 38 has a lower surface 44 an outer edge 46 and terminates in an inner edge 48. Inner edge 48 is generally curved but has a straight portion 41. Straight portion 41 is intended to correspond to flat 22 of wafer 12. Upper end 36 of tubular portion 32 is joined substantially perpendicularly to outer edge 46 of ring 38. Ring 38 extends inwardly from upper end 36 of tubular portion 32. Clamp 30 also includes hole 43 and hole 45.

Device 10 also includes lower base 50. Base 50 is in the generally cylindrical form of a disk or a puck. Disk 50 has an upper surface 49 which includes central surface portion 52, and remaining surface portion or peripheral surface portion 53. Remaining surface portion 53 includes an outer surface portion 54 and an intermediate surface portion 56. Central surface portion 52 is separated from intermediate surface portion 56 by lip 58. Intermediate surface portion 56 is separated from outer surface portion 54 by lip 60. Disk 50 also includes an edge 62 a thickness 64 and a lower surface 66. Upper intermediate surface portion 56 includes a groove 68 spaced between lip 58 and lip 60. Groove 68 is designed to receive an O ring 70 made of Teflon or other suitable material.

Puck 50 also includes pressure equalizing holes 72 and 74 which extend from edge 62 of puck 50 to lip 58. Puck 50 further includes pins 76 and 78 which extend from outer surface portion 54.

Pins 76 and 78 are intended for aligning clamp 30 with puck 50 and securing clamp 30 in position. Pins 76 and 78 are sized for a loose fit in holes 43 and 45 respectively.

Now that the construction of device 10 has been set forth, the use and advantages of device 10 according to the principles of the present invention can be set forth and appreciated. To illustrate the operation and advantages of device 10 it will be assumed that a wafer 12 has been completed to the stage of the backside stripping process. Wafer 12 will be carefully placed on puck 50 with front surface 14 containing circuits facing central surface portion 52 of puck 50 and flat 22 of wafer 12 aligned above a straight portion of lip 58. Note that the portion of lip 60 which is above straight portion 59 of lip 58 must also be straight and that a portion of groove 68 and O ring 70 must also be straight. Lip 60 assists in positioning wafer 12 in that wafer 12 will be within lip 60 when wafer 12 is properly positioned. When so positioned, surface 14 of wafer 12 is supported at a peripheral surface portion 17 by O ring 70 so that surface 14 is spaced from and not in contact with central surface portion 52 of puck 50. Clamp 30 may then be positioned with holes 43 and 45 aligned with pins 76 and 78 respectively and then lowered so that lower surface 44 of clamp 30 rests on an outer portion or peripheral portion 19 of back surface 16 of wafer 12.

Base 50 and clamp 30 of device 10 are to be constructed of pure aluminum. Lower base 50 is to be constructed with diameter of lip 60 slightly larger than the diameter of wafer 12 so that wafer 12 will fit within lip 60 and rest on O ring 70. Clamp 30 is to be constructed so that the inside diameter of tubular portion 32 is slightly larger than the outside diameter of edge 62 of base 50.

The periphery or outer portion of back surface 16 on which lower surface 44 of clamp 30 rests is of course not stripped by the dry etching process. In sample fixtures constructed for four inch wafers this edge exclusion portion is easily maintained at less than 5 mm. Also beveled portion 42 of clamp 30 allows the backside stripping process to occur without shadowing of back surface 16 as would occur if a vertical edge were provided in place of beveled portion 42. While a sample fixture was constructed for a four inch wafer it is understood that the present invention is applicable to wafers of any size.

In accordance with the foregoing description, applicant has developed a simple fixture for protecting the front surface of semiconductor wafers during the backside stripping process. The present invention may be used with any plasma etcher having a horizontal electrode. The present invention is constructed of readily available low cost materials and very significantly reduces the number of processes used in the past for backside wafer stripping.

Although a specific embodiment of Applicant's invention is shown and described for illustration purposes, a number of variations and modifications will be apparent to those of ordinary skill in the relevant arts. It is not intended that coverage be limited to the disclosed embodiment, but only by the terms of the following claims.

We claim:

1. A fixture for protecting a first surface of a semiconductor wafer while exposing a second surface of said wafer during processing, comprising:

a lower base having an end, said end having a central surface portion and a remaining surface portion, with said central surface portion recessed from said remaining surface portion, said remaining surface portion having means for supporting a semiconductor wafer at a peripheral portion of said wafer first surface with a remaining portion of said wafer first surface spaced from said central surface portion and protected from said processing;

a clamp having a tubular portion and a ring portion, said tubular portion having an open first end and a second end, said second end joined substantially perpendicularly to said ring portion, said ring portion extending inwardly, said clamp for complementary receipt on said lower base, with said tubular portion surrounding at least a part of said lower base; and means on said clamp for resting on a peripheral portion of said second surface of said wafer, with said means comprising a lower surface on said ring portion.

2. Fixture of claim 1 wherein said means for supporting said semiconductor wafer comprises:

said remaining surface portion of said lower base having a groove, said groove for receipt of an O ring, with said O ring supporting said semiconductor wafer.

3. Fixture of claim 2 wherein said fixture further comprises said remaining surface portion of said lower base having a lip surrounding said groove, said lip for positioning said semiconductor wafer on said lower base.

4. The fixture of claim 1 further comprising at least one hole for pressure equalization, said hole extending between an edge and an inner wall of said lower base.

5. The fixture of claim 4 further comprising at least one pin and at least one hole for aligning said clamp with said lower base.

6. A fixture for use when backside stripping a semiconductor wafer, said wafer having a first surface and a second surface, comprising:

means for supporting said wafer at a peripheral portion of said first surface while protecting a remaining portion of said first surface from said backside stripping; and a clamp, said clamp having means for contacting and for covering a peripheral portion of said second surface with said remaining second surface substantially exposed to said backside stripping.

7. Fixture of claim 6 wherein said means for supporting and protecting comprises a disk, said disk having an upper surface, said upper surface having a raised peripheral portion, for supporting said wafer at said first surface with said first surface spaced from a remaining portion of said upper surface.

8. Fixture of claim 7 wherein said means for supporting and protecting further comprises sealing means located between said raised peripheral portion of said upper surface and said peripheral portion of said first surface of said wafer.

9. Fixture of claim 8 wherein said raised peripheral portion of said upper surface further comprises a groove extending along said raised peripheral portion, said groove for receiving an O ring.

10. Fixture of claim 7 wherein said raised peripheral portion of said upper surface further comprises a groove extending along said raised peripheral portion, said groove for receiving an O ring.

11. Fixture of claim 5 further comprising means for aligning said band with said disk.

12. Fixture of claim 11 wherein said means for aligning comprises at least one pin projecting from said raised peripheral portion and a hole in said band for receiving said at least one pin.

13. A fixture for protecting a first surface of a semiconductor wafer while exposing a second surface of said wafer during processing, comprising:

a lower generally cylindrical portion having a first end, said first end having a central surface portion and an peripheral surface portion, with said central surface portion recessed from said peripheral surface portion, said peripheral surface portion for supporting a semiconductor wafer with a peripheral portion of said wafer first surface resting on said peripheral surface portion of said first end and a remaining first surface portion spaced from said central surface portion;

a clamp having a tubular portion having an open first end and a second end joined substantially perpendicularly to a ring portion, said ring portion extending inwardly and having a lower surface, said clamp for complementary receipt on said lower generally cylindrical portion, with said tubular portion surrounding at least a portion of said lower generally cylindrical portion and means on said clamp for resting on a peripheral portion of said second surface of said wafer, with said means comprising a lower surface on said ring portion.

14. Fixture of claim 13 further comprising a groove in said peripheral surface portion of said first end; and
an O ring for receipt in said groove, said O ring supporting said wafer with said wafer first surface spaced from said peripheral surface portion of said first end.

15. Fixture of claim 14 further comprising said peripheral surface portion of said first end having a lip, said lip for aligning said wafer with said lower generally cylindrical portion.

16. Fixture of claim 14 further comprising means for aligning said clamp with said lower generally cylindrical portion.

17. Fixture of claim 16 wherein said means for aligning comprises at least one pin and at least one hole.

* * * * *